(12) United States Patent
Lagally et al.

(10) Patent No.: US 9,324,804 B2
(45) Date of Patent: Apr. 26, 2016

(54) GRAPHENE-ON-SEMICONDUCTOR SUBSTRATES FOR ANALOG ELECTRONICS

(71) Applicant: Wisconsin Alumni Research Foundation, Madison, WI (US)

(72) Inventors: Max G. Lagally, Madison, WI (US); Francesca Cavallo, Madison, WI (US); Richard Rojas-Delgado, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/222,163

(22) Filed: Mar. 21, 2014

(65) Prior Publication Data

US 2015/0270350 A1    Sep. 24, 2015

(51) Int. Cl.
 *H01L 29/16* (2006.01)
 *H01L 29/161* (2006.01)
 *H01L 21/18* (2006.01)

(52) U.S. Cl.
 CPC .......... *H01L 29/1606* (2013.01); *H01L 21/185* (2013.01); *H01L 29/161* (2013.01)

(58) Field of Classification Search
 CPC . H01L 51/56; H01L 51/5012; H01L 27/3244; H01L 2227/323; H01L 27/3246; H01L 51/0072; H01L 27/3276; H01L 51/5056; H01L 51/5072; H01L 51/5206; H01L 51/5253; H01L 51/5268; H01L 27/3248
See application file for complete search history.

(56) References Cited

U.S. PATENT DOCUMENTS

| | | |
|---|---|---|
| 2011/0244662 A1 | 10/2011 | Lee et al. |
| 2012/0003438 A1 | 1/2012 | Appleton et al. |
| 2012/0068157 A1 | 3/2012 | Kub |
| 2012/0085991 A1 | 4/2012 | Cohen et al. |
| 2012/0141799 A1* | 6/2012 | Kub et al. ..................... 428/408 |
| 2012/0181507 A1 | 7/2012 | Dimitrakopoulos et al. |
| 2013/0027778 A1 | 1/2013 | Currie et al. |
| 2013/0099195 A1 | 4/2013 | Seacrist et al. |
| 2013/0108839 A1 | 5/2013 | Arnold et al. |
| 2013/0160701 A1 | 6/2013 | Arnold et al. |
| 2014/0264281 A1* | 9/2014 | Niyogi et al. .................. 257/29 |
| 2015/0037048 A1* | 2/2015 | Na et al. ....................... 398/214 |

FOREIGN PATENT DOCUMENTS

EP    2540662    1/2013
JP    2012-172065    9/2012

OTHER PUBLICATIONS

Lippert et al., Graphene Grown on Ge(001) from Atomic Source, Obtained online from Cornell University Library, published prior to Mar. 21, 2014.
T. Wogan, Growing great graphene on germanium, Chemistry World, http://www.rsc.org/chemistryworld/2014/04/growing-great-graphene-germanium-defect-free-electronics, Apr. 3, 2014.

(Continued)

*Primary Examiner* — Jerome Jackson, Jr.
*Assistant Examiner* — Charles R Peters
(74) *Attorney, Agent, or Firm* — Bell & Manning, LLC

(57) ABSTRACT

Electrically conductive material structures, analog electronic devices incorporating the structures and methods for making the structures are provided. The structures include a layer of graphene on a semiconductor substrate. The graphene layer and the substrate are separated by an interfacial region that promotes transfer of charge carriers from the surface of the substrate to the graphene.

12 Claims, 8 Drawing Sheets

(56) References Cited

OTHER PUBLICATIONS

Lee et al., Wafer-Scale Growth of Single-Crystal Monolayer Graphene on Reusable Hydrogen-Terminated Germanium, Science, vol. 344, Apr. 18, 2014, pp. 286-289.
Wang et al., Direct Growth of Graphene Film on Germanium Substrate, Scientific Reports, vol. 3, No. 2465, Aug. 19, 2013.
Prabhakaran et al., Distinctly different thermal decomposition pathways of ultrathin oxide layer on Ge and Si surfaces, Applied Physics Letters, vol. 76, No. 16, Apr. 17, 2000, pp. 2244-2246.
Nazarenkov et al., Mechanism of photo-stimulated processes in GeOx films, Thin Solid Films, vol. 254, 1995, pp. 164-168.
A. Toriumi, Recent Progress of Germanium MOSFETs, 2012 IEEE International Meeting for Future of Electron Devices, Kansai (IMFEDK), Osaka, May 9, 2012, pp. 1-2.
Wang et al., Germanium nanowire field-effect transistors with SiO2 and high-k HfO2 gate dielectrics, Applied Physics Letters, vol. 83, No. 12, Sep. 22, 2003, pp. 2432-2434.
K. Saraswat, Novel Electronic and Optoelectronic Devices in Germanium Integrated on Silicon, ECS Transactions, vol. 33, No. 6, 2010, pp. 101-108.
Saraswat et al., High performance germanium MOSFETs, Materials Science and Engineering B, vol. 135, 2006, pp. 242-249.
Toriumi et al., Material Potential and Scalability Challenges of Germanium CMOS, 2011 IEEE International Electron Devices Meeting (IEDM), Washington, DC, Dec. 5, 2011, pp. 28.4.1-28.4.4.
Y. Kamata, High-k/Ge MOSFETs for future nanoelectronics, materials today, vol. 11, No. 1-2, Jan. 2008, pp. 30-38.
Brunco et al., Germanium MOSFET Devices: Advances in Materials Understanding, Process Development, and Electrical Performance, Journal of the Electrochemical Society, vol. 155, No. 7, May 23, 2008, pp. H552-H561.
Chui et al., A Sub-400° C. Germanium MOSFET Technology with High-K Dielectric and Metal Gate, International Electron Devices Meeting, 2002. IEDM '02, San Francisco, CA, Dec. 8, 2002, pp. 437-440.
Klekachev et al., Graphene Transistors and Photodetectors, The Electrochemical Society Interface, vol. 22, No. 1, Spring 2013, pp. 63-68.
Bodlaki et al., Ambient stability of chemically passivated germanium interfaces, Surface Science, vol. 543, 2003, pp. 63-74.
Bortug et al., Strained-Germanium Nanostructures for Infrared Photonics, ACS Nano, vol. 8, No. 4, Mar. 5, 2014, pp. 3136-3151.
Cooper et al., Experimental Review of Graphene, International Scholarly Research Network Condensed Matter Physics, vol. 2012, article ID 501686, 2012, pp. 1-56.
Online Disclosure for P130002US01, Available online prior to Mar. 21, 2014.
Li et al., Synthesis, Characterization, and Properties of Large-Area Graphene Films, ECS Transactions, vol. 19, No. 5, 2009, pp. 41-52.
Biro et al., Nanopatterning of graphene with crystallographic orientation control, Carbon, vol. 48, Apr. 14, 2010, pp. 2677-2689.
Nemes-Incze et al., Graphene nanoribbons with zigzag and armchair edges prepared by scanning tunneling microscope lithography on gold substrates microscope lithography on gold substrates, Applied Surface Science, vol. 291, Nov. 13, 2013, pp. 48-52.
Wang et al., Etching and Narrowing of Graphene from the Edges, Nature Chemistry, vol. 2, Jun. 27, 2010, pp. 661-665.
Brey, L., et al., "Electronic states of graphene nanoribbons studied with the Dirac equation," *Physical Review* (Jun. 15, 2006), vol. 73, 235411, 5 pp. See, abstract and figure 1.
Chung, H.C., et al., "Exploration of edge-dependent optical selection rules for graphene nanoribbons," *Optic Express* (Nov. 1, 2011) (Online), vol. 19, pp. 23351-23363. See, abstract and figure 1.
Lee, Jae-Hyun, et al., "Supplementary Materials for 'Wafer-scale growth of single-crystal monolayer graphene on reusable hydrogen-terminated germanium,'" *Science* (Apr. 3, 2014) (Online), vol. 344 (figures S4, S6, and pp. 2 and 10), 22 pp. Available @ http://www.sciencemag.org/content/344/6181/286/suppl/DC1.
International Search Report & Written Opinion issued on Oct. 30, 2015, for Intl. Patent Appl. No. PCT/US2015/049325, 11 pp.

\* cited by examiner

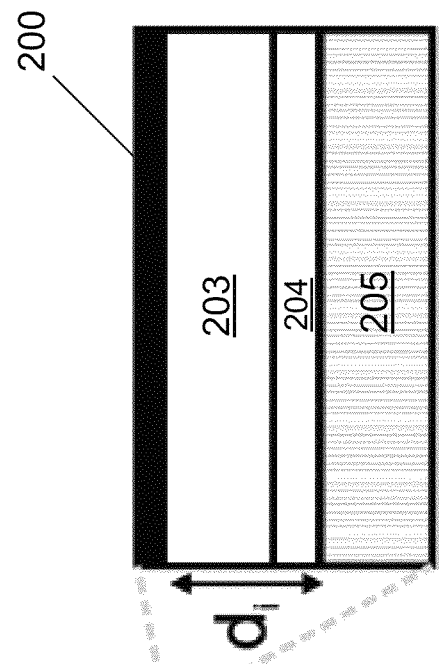
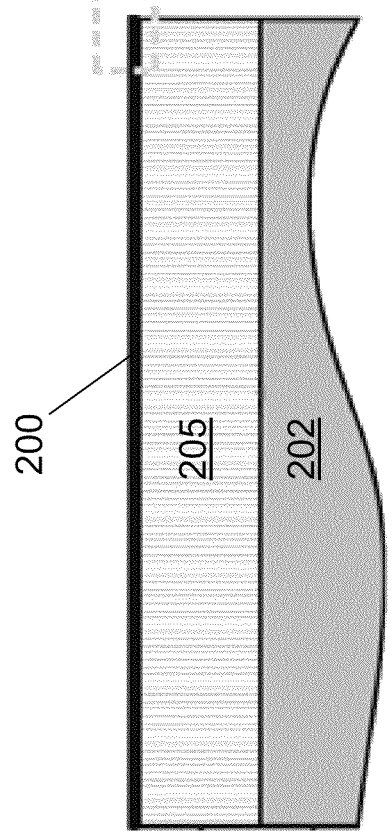
FIG. 2(B)
FIG. 2(A)

GRAPHENE-ON-SEMICONDUCTOR SUBSTRATES FOR ANALOG ELECTRONICS

REFERENCE TO GOVERNMENT RIGHTS

This invention was made with government support under DE-FC02-03ER46028 awarded by the US Department of Energy. The government has certain rights in the invention.

BACKGROUND

The excellent charge carrier mobility of graphene suggests several applications in fast analog electronics, including transistors potentially operating in the terahertz (THz) regime, as well as graphene interconnects with low resistance and capacitance to replace copper. Furthermore, the ambipolar nature of transport in graphene, together with the high mobility of charge carriers, makes possible new non-linear device architectures, such as frequency multipliers, mixers, and modulators. These devices have potential application in radiofrequency (RF) and mixed-signal circuits. None of them requires a band gap in graphene or a high on-off ratio for switching, and thus such devices are independent of the extensive efforts to create a band gap in graphene to enable its use for logic applications. In addition to a high mobility, a high carrier concentration is preferable for optimum function of these devices. Thus maximizing mobility is not the only goal when investigating graphene conductors for these applications.

The realization of any graphene-based devices is also dependent on finding functional materials structures where the high conductivity observed for freestanding sheets of graphene is maintained. Mobility values of $\sim 10^5$ cm$^2$/Vs (T=300K) and $\sim 10^6$ cm$^2$/Vs (T=4.2K) have been measured at typical carrier concentrations n$\sim 10^{11}$ cm$^{-2}$ for exfoliated graphene suspended bridge-like and contacted at its ends. (K. Bolotin et al., Ultrahigh Electron Mobility in Suspended Graphene, *Solid State Commun.* 2008, 146, 351; and K. Bolotin et al., Temperature-Dependent Transport in Suspended Graphene, *Phys. Rev. Lett.* 2008, 101, 096802.) A suspension geometry imposes severe constraints on device processing and creates serious reliability issues. To overcome these limitations, several materials have been proposed and tested as hosts of grown and transferred graphene sheets, with the general conclusion that the carrier mobility of free-standing graphene is degraded by bonding to a substrate, in some cases quite significantly. The majority of studies have focused on graphene transferred onto SiO$_2$, because of the desire for a good and inexpensive dielectric substrate. They produce mobility values in the range of 10$^2$-10$^3$ cm$^2$/Vs at 300K and at a carrier concentration n$\sim 10^{12}$ cm$^{-2}$, two to three orders of magnitude lower than for suspended graphene at similar carrier concentrations. (V. E. Dorgan, M.-H. Bae, and E. Pop, "Mobility and saturation velocity in graphene on SiO$_2$. *Appl. Phys. Lett.* 2010, 97, 082112.) Transport measurements in graphene transferred to h-BN substrates showed mobilities of $\sim 10^4$-10$^5$ cm$^2$/Vs at 300 K and $\sim 10^6$ cm$^2$/Vs at 10K, with carrier concentrations n$\sim 10^{11}$-10$^{12}$ cm$^{-2}$. (Dean, C. R. et al. Boron nitride substrates for high-quality graphene electronics, *Nat Nano* 2010, 5, 722.) The latter mobilities appear to be the highest values so far achieved for supported graphene.

SUMMARY

Electrically conductive material structures, transistors incorporating the structures and methods for making the structures are provided. The structures include a layer of graphene on a semiconductor substrate. The graphene layer and the substrate are separated by an interfacial region that promotes transfer of charge carriers from the surface of the substrate to the graphene.

One embodiment of an electrically conductive structure comprises: a substrate comprising a layer of semiconductor material; a layer of graphene; an interface region separating the layer of semiconductor material from the layer of graphene, wherein the interface region provides local energy states lying within the fundamental energy bandgap of the semiconductor material, and further wherein the graphene is doped with charge carriers from these energy states. In one example of such a structure the semiconductor material is germanium, the interface region comprises sub-stoichiometric germanium oxides and germanium dioxide that provide donor-like energy states lying within the fundamental energy bandgap of germanium and having energy levels above the Fermi level of graphene, and the graphene is doped with electrons from the energy states.

One embodiment of a transistors comprises: a source electrode; a drain electrode; a gate electrode; a conducting channel in electrical contact with the source electrode and the drain electrode, the conducting channel comprising a layer of graphene; a germanium capping layer disposed over the conducting channel; a gate dielectric disposed between the gate electrode and the germanium capping layer; a germanium substrate; and an interface region separating the germanium substrate from the layer of graphene, the interface region comprising sub-stoichiometric germanium oxides and germanium dioxide. In the transistor, the sub-stoichiometric germanium oxides and germanium dioxide produce surface energy states within the fundamental energy bandgap of the germanium, and charge carriers occupying the energy states transfer to the graphene at room temperature to provide mobile charge carriers in the graphene.

One embodiment of a method of making an electrically conductive structure comprises transferring a graphene sheet onto a surface of a graphene substrate in an aqueous environment, the surface having a layer of sub-stoichiometric germanium oxide; wherein an interface region forms between the surface of the germanium substrate and the graphene sheet, the interface region comprising germanium dioxide and water-insoluble, sub-stoichiometric germanium oxides.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2(A) is a cross-sectional diagram of the structure of FIG. 1.

FIG. 2(B) shows an expanded view of the interfacial region between the graphene and the substrate of the structure in FIG. 2(A).

DETAILED DESCRIPTION

Electrically conductive material structures, analog electronic devices incorporating the structures and methods for making the structures are provided. The structures include a layer of graphene on a substrate composed of a semiconducting material, wherein the graphene layer and the substrate are separated by an interfacial region. The structures are characterized by a very high-conductivity surface region, which includes the graphene and has a high density of mobile charge carriers, and an underlying low-conductivity region that is depleted of mobile charge carriers. Because the graphene lacks an energy bandgap and can be fabricated as a very thin layer, the structures are well suited for use in analog circuits and devices, including analog transistors.

Figure 1:
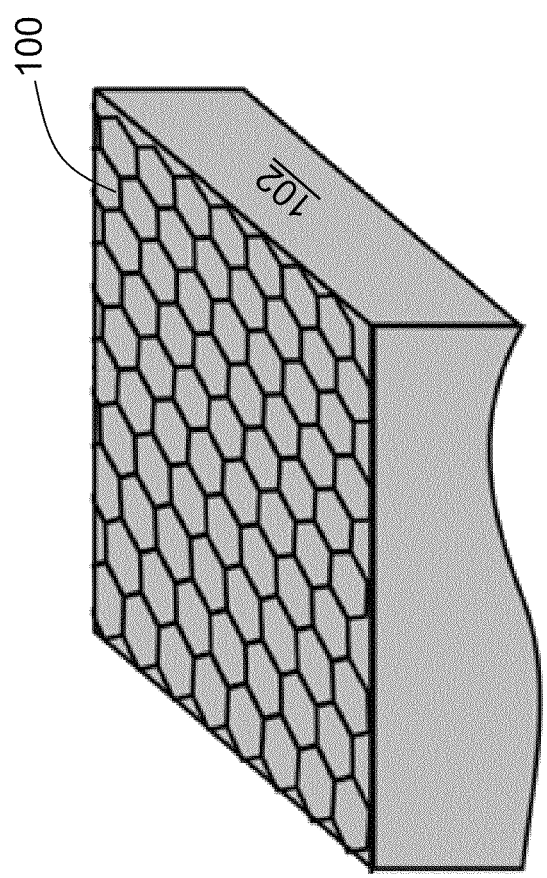
FIG. 1 is a schematic diagram showing a perspective view of an electrically conductive graphene-on-germanium structure.

A schematic diagram showing a perspective view of one embodiments of an electrically conductive structure is provided in FIG. 1. The structure includes a sheet of graphene 100 overlying the surface of a germanium substrate 102. A cross-sectional diagram of the structure is shown in FIG. 2(A) and an expanded view of the interfacial region between the graphene 200 and the substrate 202 is shown in FIG. 2(B). The interfacial region comprises a mixture of germanium oxides, including a layer comprising germanium dioxide ($GeO_2$) 203 and a layer comprising sub-stoichiometric germanium oxides ($GeO_x$, where x<2) 204. The thickness of the interface, $d_t$, is typically very small. For example the thickness may be no greater than about 10 nm. This includes embodiments in which the thickness is no greater than 5 nm and further includes embodiments in which the thickness is no greater than about 2 nm. Although the layers of stoichiometric and sub-stoichiometric oxides are depicted as having a uniform thickness with a smooth interface in FIG. 2(B), these layers may have a non-uniform thickness and may form a rough interface. In addition, while both of these layers are depicted as continuous layers in FIG. 2(B), one or both of these layers may be discontinuous. Therefore, the interfacial thicknesses recited above may refer to the average thickness of the interface region across the structure.

Without intending to be bound to any particular theory of operation, the inventors believe the extremely high electrical conductivity achieved by the structures can be attributed to a conductivity profile through the structure that includes: (1) a very narrow, high-conductivity graphene-containing surface layer; (2) a relatively wide, low-conductivity layer in the semiconductor substrate adjacent to the graphene-semiconductor interface; and (3) an underlying region of moderate conductivity that is provided by the remainder of the semiconductor substrate. This conductivity profile arises from the fact that the graphene is enriched in mobile charge carriers via the transfer of charge carriers from the surface of the semiconductor substrate by a process referred to herein as surface transfer doping. As a result of the enrichment of charge carriers in the graphene, the electrical conductivity of the present structures is dominated by the mobile charge carriers in the graphene, rather than mobile charge carriers in the underlying semiconductor substrates.

Surface transfer doping can be explained with reference to FIG. 3, which shows an electronic energy band diagram for a germanium (Ge) substrate having a surface coating comprising mixed germanium oxides (referred to as mixed-oxide terminated germanium) and for a graphene (Gr) sheet, as they exist separately (FIG. 3(A)) and in contact through an interfacial region (FIG. 3(B)). A general description of the band structures shown in FIGS. 3(A) and (B) is provided below. A more detail description is presented in the Example below.

Figure 3C:
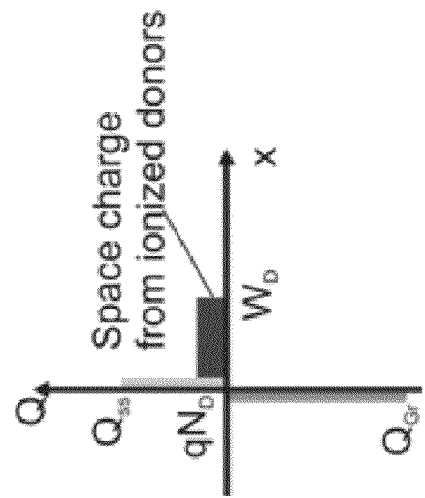
FIG. 3(C) shows the charge distribution in graphene and germanium as a result of charge distribution across the graphene/Ge interface.
Figure 3B:
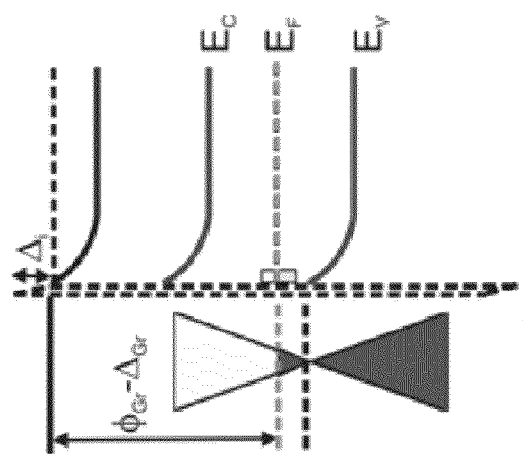
FIG. 3(B) shows the energy band diagram for the Ge substrate and graphene sheet of FIG. 3(A) in contact through an interfacial region.
Figure 3A:
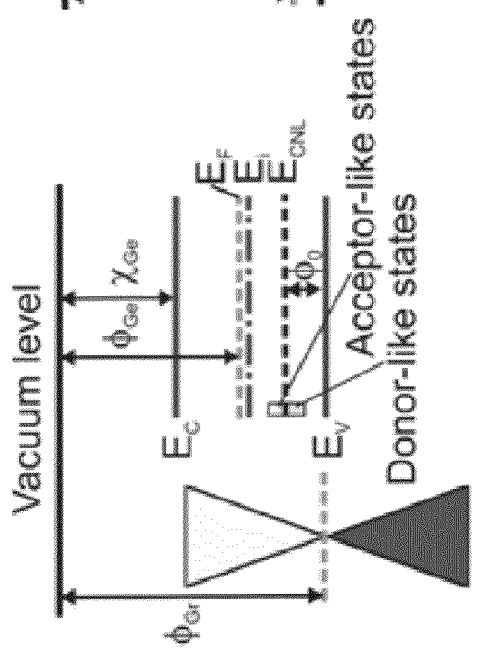
FIG. 3(A) shows an electronic energy band diagram for a germanium (Ge) substrate having a surface coating comprising mixed germanium oxides and for a graphene (Gr) sheet, as they exist separately.

As shown in FIG. 3(A), the germanium oxides create energy states having energy levels within the fundamental bandgap-between the valence band ($E_v$) and the conduction band ($E_c$)—of germanium. (D. Kuzum, K. Martens, T. Krishnamohan and K. C. Saraswat, Characteristics of surface states and charge neutrality level in Ge, *Appl. Phys. Lett.* 2009, 95, 252101; T. J. Grassman, S. R. Bishop, A. C. Kummel, An atomic view of Fermi level pinning of Ge(100) by $O_2$, *Surf. Sci.* 2008, 602, 2373; and F. Hashemi et al, Effects of surface oxide formation on germanium nanowire band-edge photoluminescence, *Appl. Phys. Lett* 2013. 102.) These surface states include acceptor-like and donor-like states. In this energy structure, electrons provided by donor states in bulk germanium will occupy the acceptor-like surface states, providing enhanced electron density and higher conductivity at the surface. The resulting negative charge that is generated at the surface is balanced by a surface charge from ionized donors in a low-conductivity electron depletion region that forms in the germanium near the surface. Below the depletion region exists a bulk region, in which the mobile charge carrier density is that of the bulk germanium from which it is formed. In the energy band diagram for graphene, the valance band and conduction band intersect at the Dirac point and the Fermi level goes through the Dirac point.

As shown in FIG. 3(b), when the graphene and substrate are brought together at an interface, electrons from the germanium donor-like states at the surface lower their energies by transferring into the graphene where they provide mobile charge carriers. As a result, the Fermi energy levels ($E_f$) for the two materials line up and the Fermi level in the graphene is shifted upward relative to the Dirac point. The result is a surface region, which includes the graphene layer at the surface of the structure, having an exceptionally high electrical conductivity. While the energy band diagrams in FIG. 3 are modeled for a lightly n-type doped Ge(001) substrate surface, similar results can be achieved using other crystal planes, including Ge(111) and Ge(110), as the surface energy states provided by their oxide coatings would also fall appropriately within the fundamental bandgap of the germanium. (H. Flietner and G. Oertel, Influence of Crystal Orientation and Oxide Structure on the Interface States of Ge—$GeO_2$, Physica Status Solidi B 1970, 41, 93.)

In the present structures, the density of energy states at the interface is sufficiently high that the charge carrier density at the interface is substantially decoupled from the dopant concentration in the bulk of the substrate. As a result, little or no benefit is achieved by increasing the dopant concentration in the substrate. In fact, if the doping level in the substrate is too high a competing conductance path for charge carriers can form within the substrate, impairing or eliminating the enhanced conductivity in the graphene surface region. For this reason, it may be desirable to use an intrinsic semiconductor or a semiconductor with a relatively low doping level as a substrate, particularly when a bulk substrate is used. For example, "intrinsic" germanium, which has a mobile-carrier concentration of about $2.4 \times 10^{13}/cm^3$ (at 300 K) is used as the substrate material in some embodiments of the structures. However, in some embodiments, the germanium substrate may be doped, provided that the dopant concentration is sufficiently low to prevent the germanium substrate, rather than the graphene-containing surface region, from becoming the primary conductance pathway through the structure. The dopant concentration at which this occurs may depend on a variety of factors, such as the thickness of the germanium substrate. If a thin layer substrate is used, the dopant concentration can be higher since thin substrates have a relatively low volume and, therefore, a relatively low number of mobile charge carriers to contribute to conductance. By way of illustration only, in some embodiments of the structures, the germanium substrates have an n-type dopant concentration on the order of about $1 \times 10^{16}/cm^3$ (at 300 K). This includes embodiments in which the germanium substrates have an n-type dopant concentration on the order of about $1 \times 10^{15}/cm^3$ (at 300 K). However, higher dopant concentrations may also be used, particularly for ultra-thin germanium substrates.

The mobile-charge carrier densities and mobilities in the graphene layer of the structures exceed those reported for graphene on other substrates, at low temperatures and at room temperature (23° C.; ~300 K), and approach the theoretical limit for doped graphene. (N. Sule and I. Knezevic, "Phonon-limited electron mobility in graphene calculated using tight-binding Bloch waves," *J. Appl. Phys.* 2012, 112, 053702.) By way of illustration, the graphene in some embodiments of the electrically conductive structures has a charge carrier (electron or hole) density of at least about $1 \times 10^{13}/cm^3$ and a charge carrier mobility of at least $5 \times 10^3 \, cm^2/Vs$ at room temperature. This includes embodiments in which the graphene has a charge carrier density of at least about $1.5 \times 10^{13}/cm^3$ and a charge carrier mobility of at least $4 \times 10^4 \, cm^2/Vs$ at room temperature. Methods for measuring the carrier densities (also referred to as carrier concentrations) and carrier mobilities are described in the Example below.

The high charge densities and mobilities combine to provide the graphene in the structures with exceedingly high electrical conductivities, which is reflected by their exceedingly low resistivities. By way of illustration, the graphene in some embodiments of the structures has a room temperature sheet resistance of no greater than about 1000Ω. This includes embodiments in which the graphene has a room temperature sheet resistance of no greater than about 100Ω and further includes embodiments in which the graphene has a room temperature sheet resistance of no greater than about 10Ω. Sheet resistivities can be measured using a four-probe method, as described in the Example below.

One embodiment of a method for making an electrically conductive structure comprises the steps of transferring a graphene sheet onto a surface of a germanium substrate in an aqueous environment, wherein the surface onto which the graphene sheet is transferred is coated by an oxide layer comprising sub-stoichiometric germanium oxides. In the resulting layered structure, an interface region comprising sub-stoichiometric germanium oxides and germanium dioxide is formed between the surface of the germanium substrate and the graphene sheet. The transfer-based fabrication scheme facilitates the formation and maintenance of an oxide interfacial region, which provides the enhanced graphene transport properties described here. As a result, the present methods are distinguishable from methods of growing graphene directly on germanium, in which no oxide interface region is formed.

Figure 4:
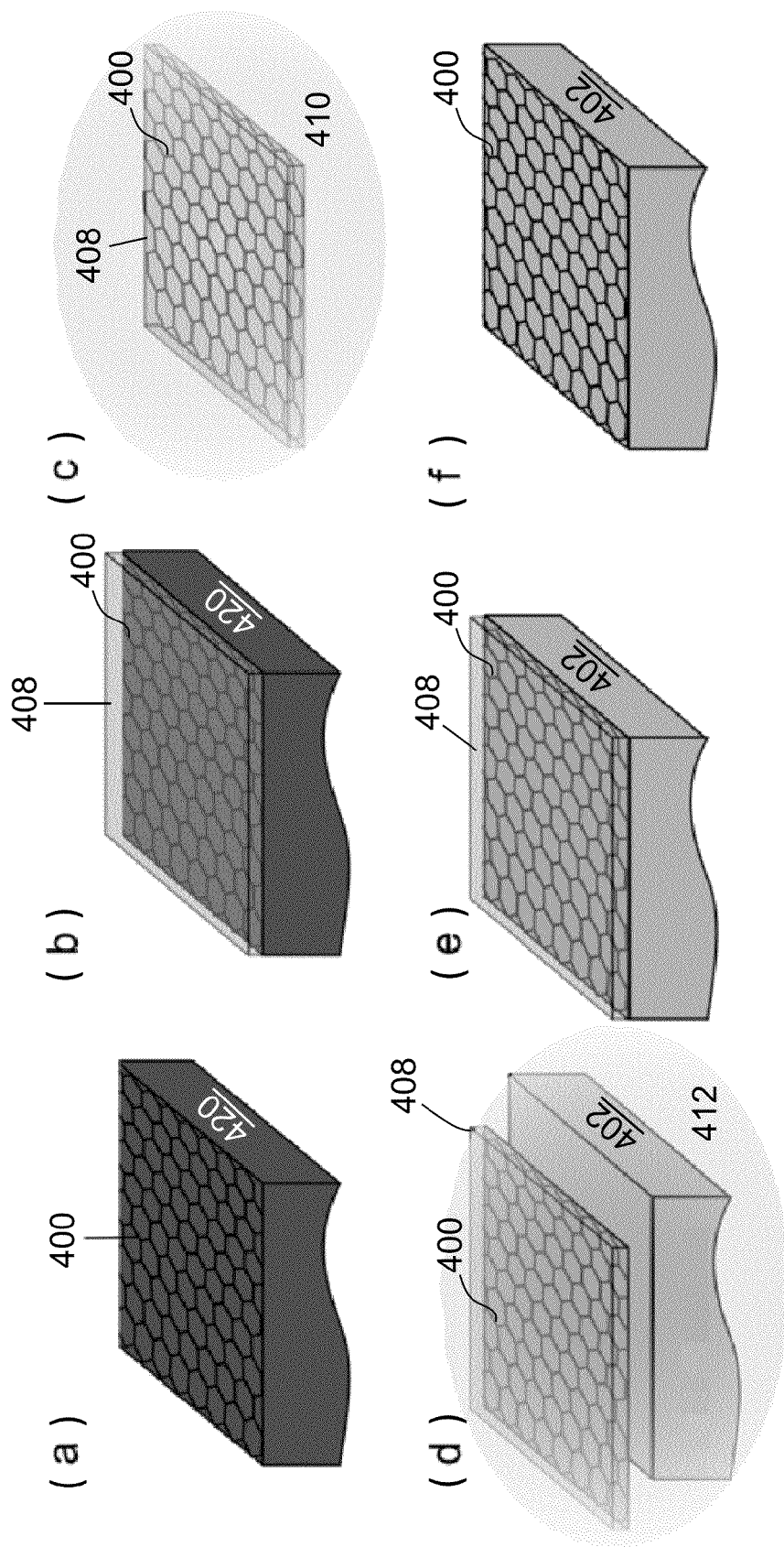
FIG. 4 is a diagram of a method of making an electrically conductive graphene-on-germanium structure.

A detailed description of a method of making the electrically conductive structures is provided in the Example below. More generally, the method is illustrated schematically in FIG. 4. As shown in panel (a) of FIG. 4, the method begins by forming a high-quality layer of graphene on the surface of a substrate. In some embodiments the layer of graphene is a single sheet of graphene. However, the layer may also comprise multi-layered graphene, including bilayered graphene. The graphene can be formed, for example, by growing one or more sheets of graphene 400 on a growth substrate 420 via chemical vapor deposition (CVD). Suitable growth substrates include metal substrates such as copper, nickel, iron, cobalt, or ruthenium foils. Using CVD growth, large-area graphene sheets having large single-crystalline domains (e.g., domains with dimensions of 100 µm or larger) can be grown. Next, a host substrate 408 is formed on, or contacted to, the exposed surface of the graphene to which it adheres, as illustrated in panel (b). For example, the host substrate can be a layer of polymeric material, such as poly(methyl methacylate) (PMMA) formed on the graphene via spin coating. Growth substrate 420 is then selectively removed from the structure. Selective removal of the growth substrate may be carried out by exposing the structure to an etchant or solvent solution that selectively dissolves or etches the growth substrate material, leaving graphene 400 adhered to host substrate 408 floating in the etchant or solvent solution 410 (panel (c)). By way of illustration, an iron chloride ($FeCl_3$) solution may be used to selectively etch a copper growth substrate.

After removal from the iron chloride solution, the graphene and host substrate are immersed in an aqueous medium, such as water 412. Graphene 400 is then lifted from the water using a germanium substrate 402, thereby transferring the graphene onto the germanium, as shown in panels (d) and (e) of FIG. 4. Finally, host substrate 408 is selectively removed, leaving a graphene-on-germanium structure (panel (f)). By way of illustration, a combination of acetone and isopropyl alcohol can be used to selectively remove a PMMA host substrate from the graphene.

The germanium substrate may be a bulk germanium substrate, such as a germanium wafer. However, it may also comprise an ultra-thin layer of germanium. Such ultra-thin layers of germanium are sometimes referred to as germanium nanomembranes and, when they are not fixedly bonded to a rigid underlying support substrate, are typically ultra-compliant and readily transferable. For example, an ultra-thin layer may have a thickness of no greater than 10 µm, no greater than 5 µm, no greater than 1 µm, no greater than 500 nm, no greater than 100 nm or no greater than 50 nm. In some embodiments of the structures, the germanium substrate is an ultra-thin layer of germanium supported on the surface of another underlying substrate, such as a silicon substrate. The underlying substrate may comprise a bulk substrate (e.g., a Si wafer) or a thin layer. By way of illustration, the thin germanium device layer of a germanium-on-insulator (GOI) structure can serve as the germanium substrate in the present structures.

While various cleaning, rinsing, baking, and annealing steps may be employed during the formation of the graphene-on-germanium structure, these steps should be carefully designed to allow for the provision and maintenance of a layer comprising sub-stoichiometric germanium oxides on the surface of the germanium substrate. Therefore, the use of acids that would etch away the $GeO_x$, such as hydrochloric acid, sulfuric acid, or nitric acid, should be avoided during the cleaning and rinsing steps. In addition, high-temperature baking and annealing steps that would decompose the $GeO_x$ should also be avoided.

Although the discussion above focuses on the use of surface-oxidized germanium substrates, the electrically conductive structures can be fabricated from other semiconductor substrates having a sufficiently high density of surface energy states to provide for surface transfer doping of the graphene in a graphene-on-semiconductor structure. Moreover, while the discussion above and Example below describe structures in which the graphene is enriched with electrons via surface transfer doping, in other embodiments, the graphene is enriched with holes. In general the structures comprise a semiconductor substrate and a layer of graphene separated by an interface region. The surface of the semiconductor substrate provides energy states lying within the fundamental energy bandgap of the semiconductor material and the density of these energy states is sufficiently high that electrical conductance due to charge carriers transferred to graphene from the energy states dominates the conductance of the structure. For graphene-on-semiconductor structures in which the energy states are higher than the Fermi level of graphene, surface transfer doping will provide electron-enriched graphene. Alternatively, for graphene-on-semiconductor structures in which the surface energy states are lower than the Fermi level of graphene, surface transfer doping will provide hole-enriched graphene. Therefore, a wide range of semiconductor materials having surface acceptor-like and donor-like energy states with appropriate energy levels can be used as a substrate. These materials can be identified based on known energy band structures, or energy band structures that can be calculated using known methods. In some embodiments, the surfaces of the semiconductor substrates are functionalized with organic molecules in order to provide the surface energy states.

Due to their exceptionally high electrical conductivity, the present graphene-on-semiconductor structures can be used in analog circuits and devices. Moreover, because the structures can utilize a germanium substrate, they are readily integrated with other germanium-based electronics, such as optoelectronics and high-frequency digital electronics, that are increasingly being fabricated in germanium.

Figure 5:
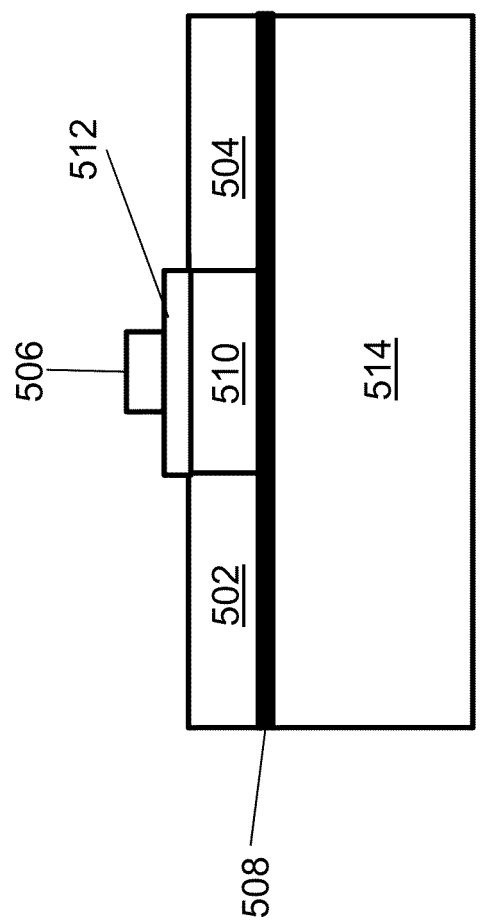
FIG. 5 is a schematic diagram of a field effect transistor that incorporates a graphene-on-germanium structure into its channel.

In some applications, the structures can be used as wires or interconnects as replacements for more traditional conductive materials, such as copper. The use of the present structures as wires and interconnects may be advantageous relative to more conventional materials, since the present structures can provide mechanically flexible and transparent connections. The highly conductive surface regions of the structures also render them suitable for use as channel materials in high-speed transistors for use in analog applications. A schematic diagram of a field effect transistor that incorporates a graphene-on-semiconductor structure into the channel is shown in FIG. 5. This embodiment of a field effect transistor comprises: a source electrode 502; a drain electrode 504; gate electrode 506; a conducting channel 508 in electrical contact with the source electrode and the drain electrode; a germanium capping layer 510 disposed over the conducting channel; a gate dielectric 512 disposed between the gate electrode and the germanium capping layer; and a germanium substrate 514. In the field effect transistor, the high-conductivity surface region comprising the graphene layer of a graphene-on-germanium structure serves as the channel material and the germanium substrate of the structure provides the transistor substrate.

Transistors comprising the present structures can be used in a variety of analog applications where they are operated in the on-state. For example in a radiofrequency amplifier, the transistor would be operated in the on-state and the signal to be amplified would be superimposed onto the DC gate-source voltage.

EXAMPLE

This example illustrates a method of fabricating graphene-on-germanium structures having a mixed oxide interface and further illustrates the exceptional charge carrier transport properties of the graphene layer in the structures.

The sheet resistance ($R_{xx}$) for graphene transferred to lightly n-doped Ge (001) (nominal bulk dopant concentration $N_D \sim 10^{13}/cm^3$) with different surface conditions and to H-terminated Si (001) was investigated. The sheet resistance for graphene transferred onto a $SiO_2$/bulk Si substrate was studied as a reference system.

Experimental

Graphene was grown via CVD on a Cu foil, etched and then transferred to a substrate using the techniques described in B. Alemán et al. Transfer-free batch fabrication of large-area suspended graphene membranes, *ACS Nano* 2010, 4, 4762. The graphene was cut into 2 cm×2 cm squares to ensure that a PMMA host substrate layer could be coated evenly on its surface via spin coating. The graphene on the Cu foils was flattened by pressing it between two parallel glass slides. PMMA was then spin coated onto the exposed graphene surface at 3,000 RPM for 60 sec. A 100 W $O_2$ plasma etch was used to selectively remove the PMMA that deposited over the backside of the Cu foil. The Cu foil was then selectively etched away by immersing the Cu foil in a 2M $FeCl_3$ solution overnight (~16 hrs). The graphene/PMMA films were left floating on the $FeCl_3$ solution. The films were subsequently lifted out of the solution using a handling substrate and immediately immersed in deionized (DI) water, where they were released from the handling substrate. The freely floating graphene/PMMA films remained in the DI water for 10 min to remove any remaining etching solution, then rinsed three more times using fresh DI water.

The substrates were cleaned in preparation for the transfer of the graphene and X-ray photoelectron spectroscopy (XPS) was used to monitor the surface oxides on the germanium substrate throughout the cleaning and transfer processes. Initially, all of the substrates were cleaned by 5 minutes of sonication in acetone followed by 5 minutes of sonication in isopropyl alcohol (IPA). The substrates were then dipped in DI water and blow dried with nitrogen. These cleaning steps removed oils and organic and/or metallic contaminants from the substrates. For the germanium substrates these steps also removed $GeO_2$, but left the $GeO_x$ intact on the surface of the germanium. In a second cleaning step, the Ge substrates were exposed to UV ozone at 55° C. for 10 minutes. This removed organic contaminants and resulted in the regrowth of $GeO_2$ on the germanium. Finally, the germanium substrates were introduced into a DI water bath at 85° C. for 5 min. This removed additional embedded contaminants and also dissolved $GeO_2$ that had formed on the surface during the previous cleaning step. Again, surface $GeO_x$ remained intact on the substrate surfaces. Thus, the resulting germanium substrates comprised a surface layer of sub-stoichiometric germanium oxides.

The graphene/PMMA films were transferred onto the cleaned Ge(001), hydrogen-terminated Si(001), and oxidized Si substrates by using those substrates to lift the films from the DI water. When the graphene was transferred onto the surface of the Ge(001) substrate, $GeO_2$ was reformed at the interface between the graphene and the germanium to provide a mixed-oxide interface comprising both stoichiometric and sub-stoichiometric germanium oxides.

After transfer, the graphene-on-substrate structures were removed from the DI water, exposed to ambient air at room temperature for 10 minutes, then subjected to baking on a hot plate at 85° C. for 5 minutes to evaporate residual water. Finally, the PMMA was selectively removed from the transferred graphene by boiling for 5 minutes in acetone, followed by boiling for 5 minutes in IPA.

Figure 6:
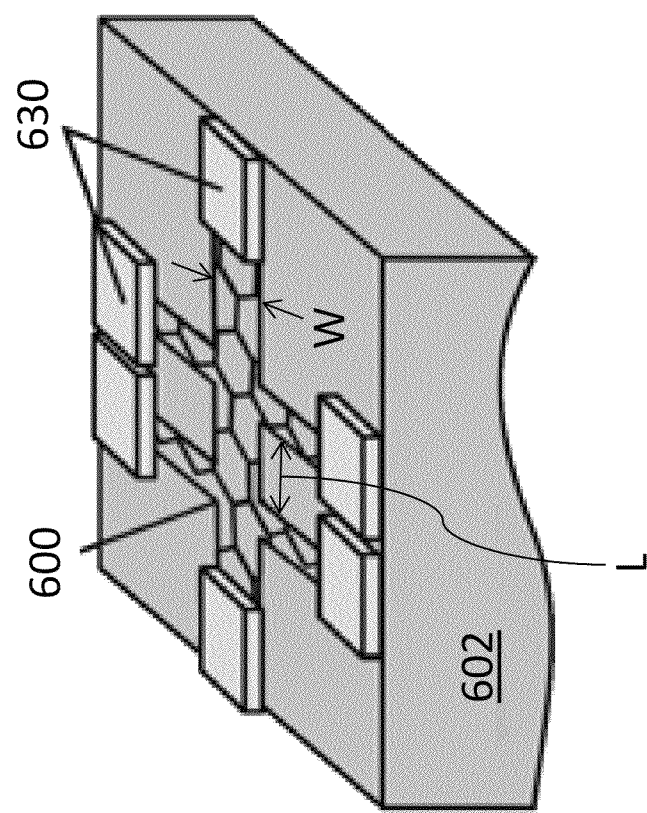
FIG. 6 shows a Hall bar set-up for four-probe resistance measurements.

Characterization:

A Hall bar set-up in a four-probe resistance measurement geometry was used to measure Hall voltages as a function of magnetic field and temperature from 300 K to 10 K. The Hall bars were fabricated into the graphene of the graphene-on-substrate structures using standard photolithography techniques. The set-up, illustrated schematically in FIG. 6, included 6 metal contacts 630 on graphene 600 over the intrinsic-germanium substrate 602. The Hall bars were used to make four-probe sheet resistance measurements. The sheet resistance measurements used separate pairs of current-carrying and voltage-sensing electrodes to make more accurate measurements than those obtained with traditional two-terminal sensing. The key advantage of four-terminal sensing is that the separation of the current and voltage electrodes eliminated the impedance contribution of the wiring and contact resistances. The set-up for the resistance measurements was composed of a precision semiconductor parameter analyzer (SPA) Agilent 4156C (input impedance$\geq 10^{15}\Omega$, current set resolution 1 nA, and voltage measurement resolution 2 µV) to measure the resistance, a MM micromanipulator, two MM model 210 probes, two SOSS Micro Tec PH120 probes, and Agilent Easy Expert software. The Hall bars were 287 µm long (L) and 85 nm wide (W) with contact pads 200×200 µm².

The surface chemical condition of the Ge(001) were investigated using a commercial XPS instrument (Phi 5400 XPS).

Figure 7:
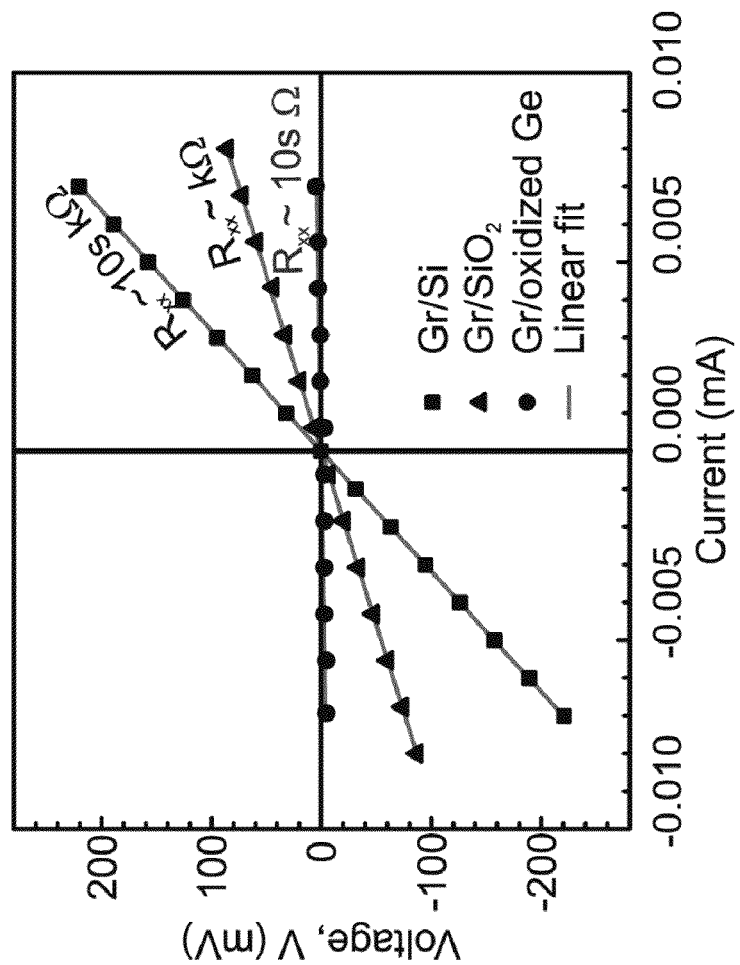
FIG. 7 is a graph of the voltage-current characteristic measured for graphene transferred onto $SiO_2$, H-terminated Si(001), and mixed-oxide terminated Ge(001).

Results:

Using the Hall bars, sheet resistance measurements in the four-probe geometry at temperatures ranging from 300K to 10K were obtained. Voltage-current (V-I) characteristics acquired at 300K are compared in FIG. 7 for identical graphene Hall bars on the three substrates, namely $SiO_2$, H-terminated Si(001), and Ge(001). The difference in slopes of the V-I curves acquired for graphene on these three materials confirmed the strong influence of the supporting substrate on lateral charge transport in graphene. Specifically, V-I characteristics measured for graphene-on-$SiO_2$ and graphene-on-H-terminated Si(001) yielded sheet resistances of 3.3 kΩ/sq and 9.8 kΩ/sq, respectively. For graphene-on-Ge(001), the sheet resistance was only 0.16 kΩ/sq (FIG. 7).

Motivated by these observations, x-ray photoelectron spectroscopy (XPS) measurements of the Ge(001) substrate were acquired before and after graphene was transferred to that substrate. Spectra were obtained from the bare Ge substrates after the cleaning procedure detailed above and immediately before the transfer of the graphene. The spectra were dominated by two peaks corresponding to Ge (~29 eV) and C (~286 eV). After the graphene transfer, a $GeO_2$ layer formed at the interface over time, as shown by a peak arising at ~32 eV in the spectra. The V-I curve shown in FIG. 7 for graphene on the oxidized Ge was measured between 24 and 48 h after the graphene was first transferred onto the Ge.

The low sheet resistance measured for the graphene-on-Ge structure can be explained using a simple physical model based on traditional metal-semiconductor junction theory and the unique energy structure in graphene. Charge transfer is expected to occur between the graphene layer and the Ge substrate, leading to the doping of the graphene and/or the graphene and the germanium oxide-containing interfacial region. The type and concentration of carriers transferred to and from the graphene was calculated according to the band structure reported in the literature for graphene and oxidized Ge. (A. H. Neto et al., The Electronic Properties of Graphene, *Rev. Modern Physics* 2009, 81, 109; D. Kuzum, K. Martens, T. Krishnamohan and K. C. Saraswat, Characteristics of surface states and charge neutrality level in Ge, *Appl. Phys. Lett.* 2009, 95, 252101; and T. J. Grassman, S. R. Bishop, A. C. Kummel, An atomic view of Fermi level pinning of Ge(100) by $O_2$, *Surf. Sci.* 2008, 602, 2373.) In the analysis a real graphene/Ge junction was considered, i.e., the effect of interfacial states was taken into account. The presence of the interfacial states is a function of the processing procedure used to prepare and contact the graphene and the Ge substrate. XPS studies confirmed that a mixed $GeO_x/GeO_2$ layer was present at the graphene/Ge interface.

FIG. 3(A) shows a simplified band diagram of graphene and lightly doped n-type Ge as it looks before the two materials come into contact. The graphene work function is taken to be 4.5 eV, i.e., higher than the work function of n-type Ge at any doping level considered here. From previous theoretical and experimental studies, the oxidized Ge surface, having a layered structure $Ge/GeO_x/GeO_2$, is known to have a mixture of acceptor- and donor-like trap states, with the charge neutrality level (CNL) (i.e., the energy marking the point at which their densities are equal) located ~0.18 eV above the valence band maximum of Ge. A density of states ($D_{it}$) in the range of $10^{13}$-$10^{14}$ cm$^{-2}$ eV$^{-1}$ has been reported in the literature for $Ge/GeO_x/GeO_2$. (D. Kuzum, K. Martens, T. Krishnamohan and K. C. Saraswat, Characteristics of surface states and charge neutrality level in Ge, *Appl. Phys. Lett.* 2009, 95, 252101; and T. J. Grassman, S. R. Bishop, A. C. Kummel, An atomic view of Fermi level pinning of Ge(100) by $O_2$, *Surf. Sci.* 2008, 602, 2373.) FIG. 3(B) shows the band diagrams of the graphene/Ge junction in thermal equilibrium after contact has occurred. Electrons have transferred from donor-like states at the Ge surface to graphene, leaving a positive surface charge (hole accumulation) behind. At the same time electrons residing in donor levels in the bulk of Ge lower their energy by occupying acceptor-like states at the Ge surface. Electrons transferred from bulk Ge to surface states leave behind an equal number of ionized donors in a region depleted of mobile carriers. Band-bending then occurs in Ge as the Fermi levels of graphene and Ge line up across the interface in proximity of the CNL (see FIG. 3(B)).

Charge transfer between the graphene and Ge has broken the symmetry of the electron and hole concentrations in the graphene, which is now electron doped. The Fermi level of graphene has risen from the Dirac points towards that of the Ge (n-type to a greater or lesser degree). FIG. 3(C) schematically illustrates the charge distribution in the graphene and Ge. A sheet of mobile electrons in the graphene is counter-balanced by the positive charge associated with holes accumulated at the graphene/Ge interface and by ionized donors in Ge.

Figure 8:
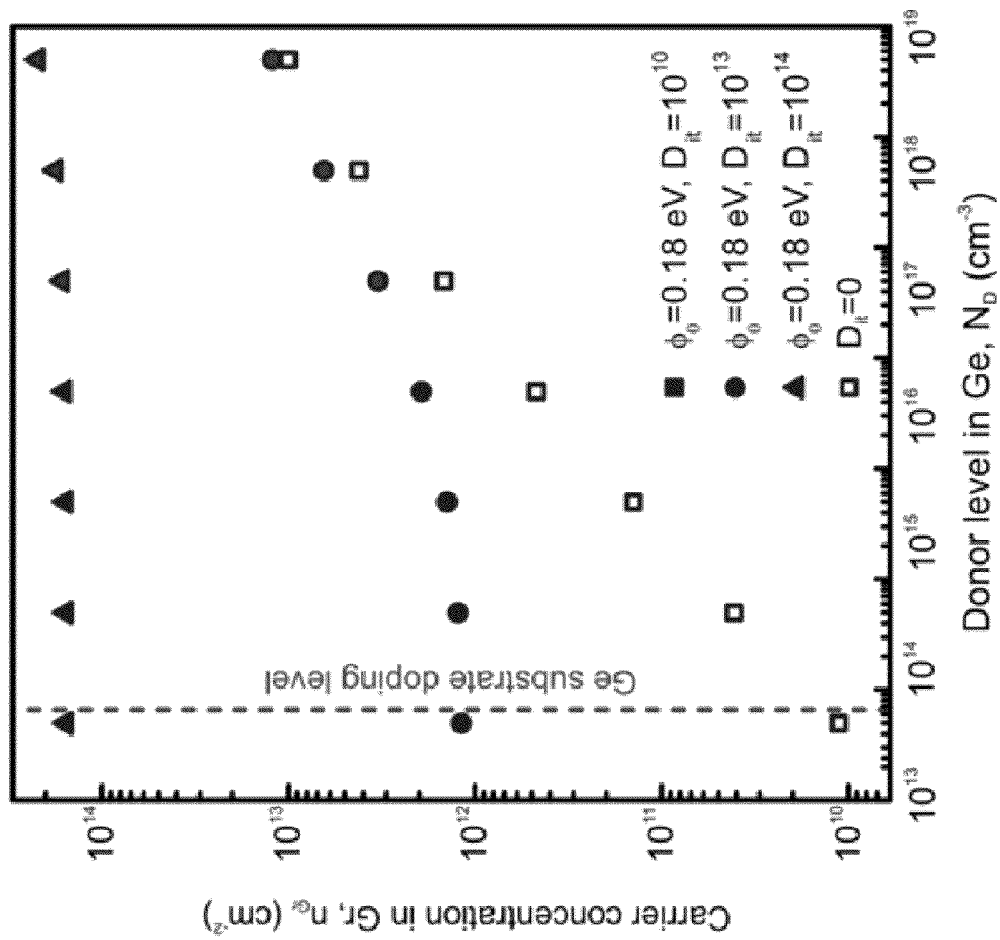
FIG. 8 shows a plot of the calculated carrier density in graphene vs. the doping concentration in Ge transferred to different substrates, as described in the Example.

Using the models discussed above and illustrated in FIGS. 3 (A)-(C) the density of charge carriers transferred to Gr bonded to a n-type Ge substrate that has a doping level $N_D$ in the range of $5\times10^{13}$ to $5\times10^{19}$ cm$^{-3}$ was calculated. The results obtained for ideal and real graphene/Ge junctions were compared. Values for $D_{it}=\{10^{10}, 10^{13}, 10^{14}\}$ cm$^{-2}$ eV$^{-1}$ at $\phi_0$=0.18 eV were selected. FIG. 8 shows a plot of the calculated carrier density in graphene vs. the doping concentration in Ge for all the investigated cases. In an ideal graphene/Ge junction (no interface states), the amount of charge transferred to graphene from Ge is predicted to increase monotonically with the Ge doping level. This result reflects the fact that Ge substrates with an increasingly high doping level have their Fermi energy increasingly farther from the graphene Fermi level when the two systems are not in contact. (S. M. Sze, Physics of Semiconductor Devices, $2^{nd}$ Ed., New York: Wiley, 1981.) Hence a higher Ge doping results in a higher driving force for charge transfer across the graphene/Ge interface.

When interface states are present only a relatively high $D_{it}$ can overwhelm the effect of charge transfer from bulk donor states in Ge to graphene. Indeed, results for $D_{it}=10^{10}$ cm$^{-2}$ eV$^{-1}$ were indistinguishable from those for $D_{it}=0$. In contrast, as seen in FIG. 8, in a graphene/Ge junction with $D_{it}=10^{14}$ cm$^{-2}$ eV$^{-1}$, the concentration of carriers transferred to the graphene had only a very weak dependence on the bulk Ge substrate doping level, such that the charge carrier density at the interface is substantially decoupled from the dopant concentration in the bulk of the substrate. At lower $D_{it}$ a decreasing effect of the interface condition on the charge transfer is predicted. When the density of interface states is sufficiently high, the effect on doping of graphene will, however, be quite significant.

The dashed line in FIG. 8 marks the nominal doping level of the Ge substrates used in the experiments. The interface model described above gives an expected $D_{it}$ of the order of $10^{13}$-$10^{14}$ cm$^{-2}$ eV$^{-1}$. Corresponding values of carrier concentration in graphene were extracted from FIG. 8 as $n_{Gr}\sim 1.4\times 10^{12}$ cm$^{-2}$ and $n_{Gr}\sim 2\times 10^{14}$ cm$^{-2}$ for these values of $D_{it}$. In this scenario the excess carriers in graphene are electrons. As stated earlier and shown in FIG. 3(C), electrons in graphene are counterbalanced by holes accumulating on the Ge surface and the positive fixed charge of ionized donors. In the limit of high $D_{it}$ the charge at the Ge surface is approximately equal to the charge in graphene. This surface region, which includes the graphene layer, is enriched (doped) with mobile carriers and separated from the bulk Ge by a depletion region. Specifically, the width of the depletion region is of the order of several hundreds of micrometers at a $D_{it}\sim 10^{13}$-$10^{14}$ cm$^{-2}$ eV$^{-1}$ and $N_D\sim 6\times 10^{13}$ cm$^{-2}$, which is the nominal doping concentration in the Ge substrates. The very low resistivity measured for graphene/mixed-oxide terminated Ge is attributed to two parallel paths, i.e., an electron-rich graphene sheet in parallel with a hole-rich depletion region extending into the Ge substrate from the interface.

The word "illustrative" is used herein to mean serving as an example, instance, or illustration. Any aspect or design described herein as "illustrative" is not necessarily to be construed as preferred or advantageous over other aspects or designs. The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An electrically conductive structure comprising:
a substrate comprising a layer of germanium;
a layer of graphene;
an interface region comprising sub-stoichiometric germanium oxides and germanium dioxide separating the layer of germanium from the layer of graphene, wherein the interface region provides surface energy states lying within the fundamental energy bandgap of the germanium and having energy levels above the Fermi level of graphene, and further wherein the graphene is doped with electrons from the surface energy states.

2. The structure of claim 1, wherein the layer of germanium has a thickness of no greater than 10 μm.

3. The structure of claim 2, wherein the germanium substrate comprises n-doped germanium having an n-type dopant concentration of no greater than $1\times 10^{17}$ cm$^{-3}$ at 300 K.

4. The structure of claim 1, wherein the germanium substrate comprises n-doped germanium having an n-type dopant concentration of no greater than $1\times 10^{16}$ cm$^{-3}$ at 300 K.

5. The structure of claim 1, wherein the sheet resistance in the layer of graphene is no greater than 1000Ω at 300 K.

6. The structure of claim 5, wherein the sheet resistance in the layer of graphene is no greater than 100Ω at 300 K.

7. The structure of claim 1, wherein the interface region has a thickness of no greater than 10 nm.

8. The structure of claim 7, wherein the interface region has a thickness in the range from 2 nm to 10 nm.

9. The structure of claim 1, wherein the layer of graphene is a single sheet of graphene.

10. The structure of claim 1, wherein the layer of germanium is disposed on a layer of silicon.

11. A field effect transistor comprising:
a source electrode;
a drain electrode;
gate electrode;
a conducting channel in electrical contact with the source electrode and the drain electrode, the conducting channel comprising a layer of graphene;
a germanium capping layer disposed over the conducting channel;
a gate dielectric disposed between the gate electrode and the germanium capping layer;
a germanium substrate; and
an interface region separating the germanium substrate from the layer of graphene, the interface region comprising sub-stoichiometric germanium oxides and germanium dioxide;
wherein the sub-stoichiometric germanium oxides and germanium dioxide produce energy states within the fundamental energy bandgap of the germanium and further wherein charge carriers occupying the energy states transfer to the graphene at room temperature to provide mobile charge carriers in the graphene.

12. A method of making an electrically conductive structure, the method comprising transferring a graphene sheet onto a surface of a graphene substrate in an aqueous environment, the surface having a layer of sub-stoichiometric germanium oxide; wherein an interface region forms between the surface of the germanium substrate and the graphene sheet, the interface region comprising germanium dioxide and water-insoluble, sub-stoichiometric germanium oxides.

* * * * *